(12) United States Patent
Chen et al.

(10) Patent No.: US 10,205,091 B2
(45) Date of Patent: Feb. 12, 2019

(54) MONOCRYSTALLINE MAGNETO RESISTANCE ELEMENT, METHOD FOR PRODUCING THE SAME AND METHOD FOR USING SAME

(71) Applicant: NATIONAL INSTITUTE FOR MATERIALS SCIENCE, Tsukuba-shi, Ibaraki (JP)

(72) Inventors: Jiamin Chen, Tsukuba (JP); Yuya Sakuraba, Tsukuba (JP); Jun Liu, Tsukuba (JP); Hiroaki Sukegawa, Tsukuba (JP); Kazuhiro Hono, Tsukuba (JP)

(73) Assignee: NATIONAL INSTITUTE FOR MATERIALS SCIENCE, Tsukuba-Shi, Ibaraki (JP)

( * ) Notice: Subject to any disclaimer, the term of this patent is extended or adjusted under 35 U.S.C. 154(b) by 5 days.

(21) Appl. No.: 15/424,515

(22) Filed: Feb. 3, 2017

(65) Prior Publication Data
US 2017/0229643 A1    Aug. 10, 2017

(30) Foreign Application Priority Data

Dec. 4, 2015 (JP) .................................. 2015-237601

(51) Int. Cl.
*H01L 43/10* (2006.01)
*H01F 10/16* (2006.01)
(Continued)

(52) U.S. Cl.
CPC ............ *H01L 43/10* (2013.01); *H01F 10/16* (2013.01); *H01F 10/1936* (2013.01);
(Continued)

(58) Field of Classification Search
CPC .......... H01L 43/08; H01L 43/10; H01L 43/12
See application file for complete search history.

(56) References Cited

U.S. PATENT DOCUMENTS

| 6,821,652 B1* | 11/2004 | Okamoto | ................ G11B 5/66 |
| | | | 428/336 |
| 2003/0137785 A1* | 7/2003 | Saito | .................... B82Y 10/00 |
| | | | 360/324.11 |

(Continued)

FOREIGN PATENT DOCUMENTS

| JP | 5245179 B | 7/2013 |
| WO | WO 2012/093587 A1 | 7/2012 |
| WO | WO 2014/163121 A1 | 10/2014 |

OTHER PUBLICATIONS

Chen, J. et al., "Crystal Orientation Dependence of Current-Perpendicular-to-Plane Giant Magnetoresistance of Pseudo Spin-Valves With Epitaxial $Co_2Fe(Ge_{0.5}GA_{0.5})$ Heusler Alloy Layers", *Journal of Applied Physics*, vol. 115, 2014, 7 pages.

(Continued)

*Primary Examiner* — David C Spalla
(74) *Attorney, Agent, or Firm* — Brinks Gilson & Lione

(57) ABSTRACT

To provide a key monocrystalline magnetoresistance element necessary for accomplishing mass production and cost reduction for applying a monocrystalline giant magnetoresistance element using a Heusler alloy to practical devices. A monocrystalline magnetoresistance element of the present invention includes a silicon substrate 11, a base layer 12 having a B2 structure laminated on the silicon substrate 11, a first non-magnetic layer 13 laminated on the base layer 12 having a B2 structure, and a giant magnetoresistance effect layer 17 having at least one laminate layer including a lower ferromagnetic layer 14, an upper ferromagnetic layer 16, and a second non-magnetic layer 15 disposed between the lower ferromagnetic layer 14 and the upper ferromagnetic layer 16.

10 Claims, 15 Drawing Sheets

(51) Int. Cl.
  *H01F 10/28* (2006.01)
  *H01F 10/30* (2006.01)
  *H01L 43/08* (2006.01)
  *H01L 43/12* (2006.01)
  *H01F 10/193* (2006.01)
  *H01F 10/32* (2006.01)

(52) U.S. Cl.
  CPC .............. *H01F 10/28* (2013.01); *H01F 10/30* (2013.01); *H01F 10/3272* (2013.01); *H01L 43/08* (2013.01); *H01L 43/12* (2013.01); *H01F 10/3254* (2013.01)

(56) References Cited

U.S. PATENT DOCUMENTS

| | | | |
|---|---|---|---|
| 2003/0170500 A1* | 9/2003 | Shimizu | G11B 5/667 428/831.2 |
| 2013/0302649 A1 | 11/2013 | Takahashi et al. | |
| 2016/0019917 A1 | 1/2016 | Du et al. | |

OTHER PUBLICATIONS

Chen, J. et al., "Realization of High Quality Epitaxial Current-Perpendicular-to-Plane Giant Magnetoresistive Pseudo Spin-Valves on Si(001) Wager Using NiAl Buffer Layer", *APL Materials*, vol. 4, 2016, 8 pages.

Du, Y. et al., "#001# Textured Polycrystalline Current-Perpendicular-to-Plane Pseudo Spin-Valves Using $Co_2FE(Ge_{0.5}GA_{0.5})$ Heusler Alloy", *Appl. Phys. Lett.*, vol. 103, 2013, 5 pages.

Du, Y. et al., "Large Magnetoresistance in Current Perpendicular-to-Plane Pseudo Spin-Valves Using $Co_2FE(Ge_{0.5}GA_{0.5})$ Heusler Alloy and AgZn Spacer", *Appl. Phys. Lett.*, vol. 107, 2015, 6 pages.

Li, S. et al., "Enhancement of Giant Magnetoresistance by $L2_1$ Ordering in $Co_2FE(Ge_{0.5}GA_{0.5})$ Heusler Alloy Current-Perpendicular-to-Plane Pseudo Spin Vavles", *Appl. Phys. Lett.*, vol. 103, 2013, 5 pages.

Sakuraba, Y. et al., "Extensive Study of Giant Magnetoresistance Properties in Half-Metallic $Co_2$(Fe, Mn)Si-Based Devices", *Appl. Phys. Lett.*, vol. 101, 2012, 5 pages.

Yuasa, H., et al., "Output Enhancement of Spin-Valve Giant Magnetoresistance in Current-Perpendicular-to-Plane Geometry", *Journal of Applied Physics*, vol. 92, 2002, 6 pages.

* cited by examiner

FIG. 6
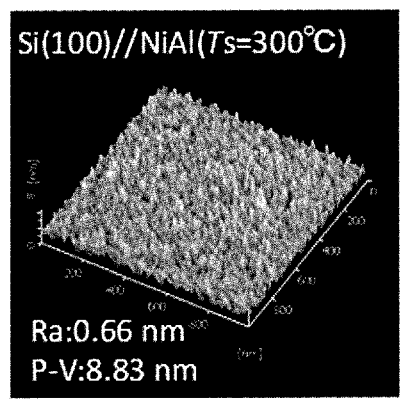
(A)
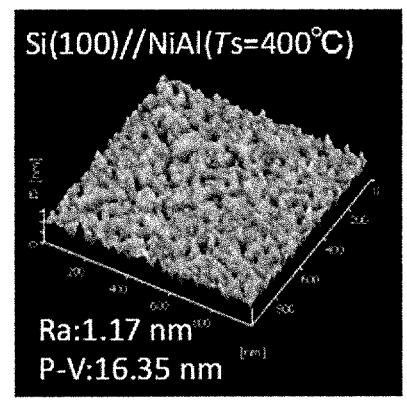
(B)
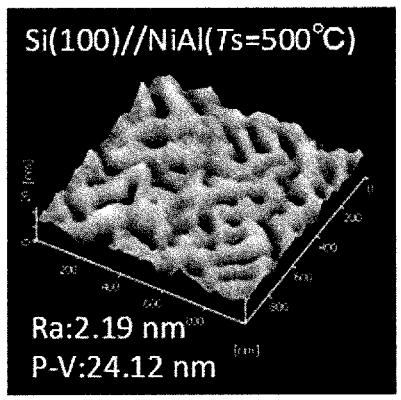
(C)
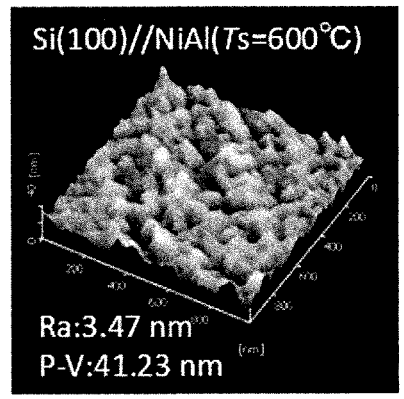
(D)

FIG. 10
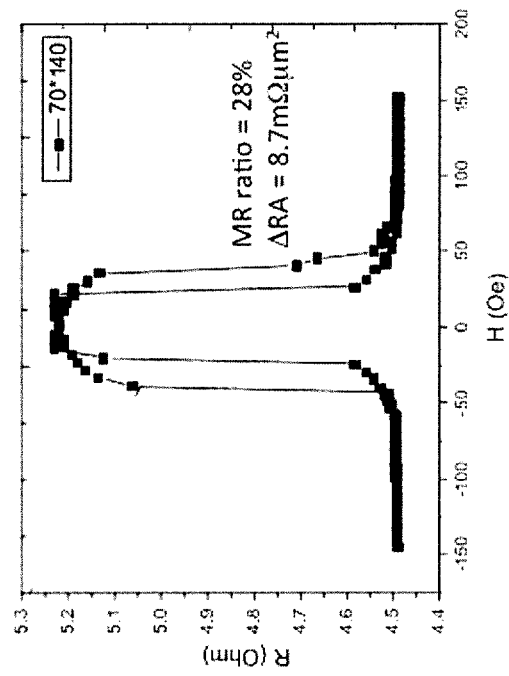
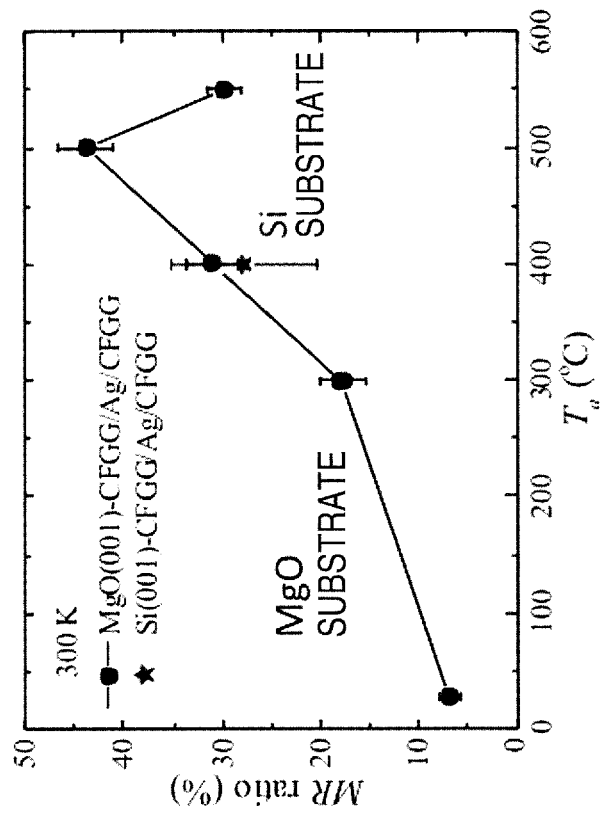

FIG. 15
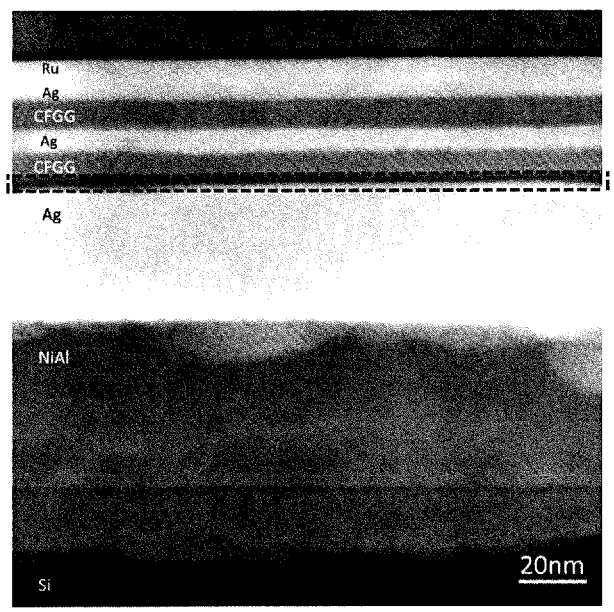
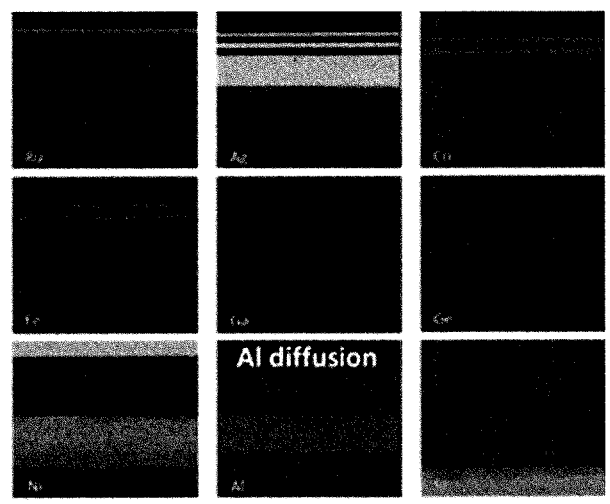

MONOCRYSTALLINE MAGNETO RESISTANCE ELEMENT, METHOD FOR PRODUCING THE SAME AND METHOD FOR USING SAME

TECHNICAL FIELD

The present invention relates to a magnetoresistance element having a ferromagnetic thin film preferably used as an electrode material of a tunnel magnetoresistance element, a current-perpendicular-to-plane giant magnetoresistance element, or the like, particularly to a monocrystalline magnetoresistance element obtained by epitaxially growing a (001) plane of a ferromagnetic thin film on a Si monocrystalline substrate having a large diameter.

In addition, the present invention relates to a device using the monocrystalline magnetoresistance element.

BACKGROUND ART

A ferromagnetic thin film of Fe, FeCo, or the like is often used as an electrode material of a tunnel magnetoresistive (TMR) element or a current perpendicular to plane-giant magnetoresistance element. Many of these ferromagnetic materials have body-centered cubic lattice (bcc) structures. These magnetoresistance elements are used for a reproduction head of a hard disc drive (HDD) or a recording element of a magnetoresistance random access memory (MRAM). In addition, a current perpendicular to plane-giant magnetoresistance (CPP-GMR) element having a Co-based Heusler alloy having a high spin polarizability as a ferromagnetic layer has a lower element resistance than a tunnel magnetoresistance element, and therefore application thereof as a magnetic head for a next-generation high density HDD is expected strongly (refer to Patent Literatures 1 and 2).

However, all of these magnetoresistance elements in practical use have polycrystalline structures. For example, a tunnel magnetoresistance element in which magnesium oxide (MgO) is a tunnel barrier using a CoFeB ferromagnetic material as an electrode is formed by the following manufacturing process.

(i) Amorphous CoFeB is formed on amorphous Ta formed on a Cu electrode.

(ii) A MgO tunnel barrier growing in a strong (001) orientation is formed on the amorphous CoFeB in (i).

(iii) Amorphous CoFeB is further formed on the MgO tunnel barrier in (ii).

(iv) The above formed multilayer film is subjected to a heat treatment, and the amorphous CoFeB is crystallized into CoFe having a body-centered cubic lattice structure.

(v) At this time, each crystal in the polycrystal has a consistency relation of (001)[001]CoFe//(001)[011]MgO using a Miller index, and therefore a tunnel electron is spin-polarized highly.

A high tunnel magnetoresistance is exhibited by (i) to (v).

Each crystal in a polycrystal crystallized from amorphous FeCoB is required to have a consistency relation of (001) [001]CoFe//(001)[011]MgO with an oxide barrier such as MgO or MgAlO in order to obtain a high tunnel magnetoresistance. Recently, a tunnel barrier of $MgAl_2O_4$, non-stoichiometric MgAlO, or the like is used in addition to MgO. In any case, in order to exhibit a high tunnel magnetoresistance, a ferromagnetic body having bcc as a basic structure, such as Fe, Co, an alloy thereof, or a Co-based Heusler alloy is required to be oriented in a (001) direction of a Miller index.

Meanwhile, a current perpendicular to plane-giant magnetoresistance (CPP-GMR) element has a structure in which a laminated film of ferromagnetic layer/non-magnetic layer/ferromagnetic layer is formed into a pillar having a submicrometer-size or less. When a current flows in a pillar, an electric resistance is changed according to a relative angle of magnetization of two ferromagnetic layers, and therefore a magnetic field can be detected electrically. However, when a general ferromagnetic body such as CoFe is used, a magnetoresistance (MR) ratio is about 3% (refer to Non-patent Literature 1), and a low sensitivity as a magnetic sensor is a problem. However, recently, in an epitaxial CPP-GMR element of Heusler alloy layer/non-magnetic layer/Heusler alloy layer, obtained by growing a Co-based Heusler alloy ($Co_2MnSi$, $Co_2(Fe_{0.4}Mn_{0.6})Si$, $Co_2Fe(Ga_{0.5}Ge_{0.5})$, or the like) having a high spin polarizability on a MgO substrate as a ferromagnetic layer, a magnetoresistance ratio as large as 30 to 60% has been achieved (refer to Non-patent Literatures 2 to 4). There is no other example of such a magnetoresistance element having a low resistance and a high magnetoresistance ratio, and application thereof to various devices such as a read head for a next-generation hard disc drive (HDD), having a surface recording density of 2 $Tbit/inch^2$ or more is expected highly.

However, an element utilizing a Heusler alloy electrode has such a serious problem that a high characteristic of a MR ratio of more than 30% can be obtained only when a (001)-oriented monocrystalline thin film manufactured on an expensive (001)-MgO substrate is subjected to a heat treatment at 500° C. or higher. It is known that when a polycrystalline element is manufactured on a generally used Si substrate with a thermal oxide film, a characteristic thereof is much poorer than that of a monocrystalline element (refer to Non-patent Literature 5). In addition, it has been reported that in a monocrystalline CPP-GMR element having a Heusler alloy as a ferromagnetic layer and having Ag as a spacer layer, a MR ratio largely depends on a crystal orientation and the highest MR output is obtained when a ferromagnetic layer is oriented in a (001) plane (refer to Non-patent Literature 6). A polycrystalline magnetoresistance element oriented in a (001) plane has been also proposed due to such a background (Patent Literature 3). It is necessary to manufacture a magnetoresistance element on a permalloy layer which has been electrodeposited as a magnetic shield for application to a currently used read head for HDD. In this case, a ferromagnetic layer is a polycrystal oriented in (011). In addition, when a heat treatment is performed at 350° C. or higher, diffusion of a permalloy layer, recrystallization, or the like occurs disadvantageously. Because of these, if a monocrystalline element having a ferromagnetic layer oriented in (001) can be grown on an inexpensive Si wafer, it is expected that a magnetoresistance element having a large MR ratio can be achieved.

CITATION LIST

Patent Literatures

Patent Literature 1: JP 5245179 B1
Patent Literature 2: WO 2012/093587 A1
Patent Literature 3: WO 2014/163121 A1

Non-Patent Literatures

Non-patent Literature 1: Yuasa et al., J. Appl. Phys. 92, 2646 (2002)
Non-patent Literature 2: Y. Sakuraba et al., Appl. Phys. Lett. 101, 252408 (2012)
Non-patent Literature 3: Li et al., Appl. Phys. Lett. 103, 042405 (2013)
Non-patent Literature 4: Du et al., Appl. Phys. Lett. 107, 112405 (2015)

Non-patent Literature 5: Du et al., Appl., Phys., Lett., 103, 202401 (2013)

Non-patent Literature 6: J. Chen et al., J. Appl., Phys., 115, 233905 (2014)

SUMMARY OF THE INVENTION

Problems to be Solved by the Invention

The present invention solves the above problem, and an object thereof is to provide a monocrystalline magnetoresistance element having a ferromagnetic layer required to achieve a high magnetoresistance ratio oriented in (001).

In addition, an object of the present invention is to provide a monocrystalline magnetoresistance element having a monocrystalline element with (001) orientation similar to that on a MgO substrate on a Si substrate having a large diameter.

In addition, an object of the present invention is to provide a device using the monocrystalline magnetoresistance element.

Means for Solving the Problems

For example, as illustrated in FIG. 1, a monocrystalline magnetoresistance element according to an aspect of the present invention includes a silicon substrate 11, a base layer 12 having a B2 structure, laminated on the silicon substrate 11, a first non-magnetic layer 13 laminated on the NiAl base layer 12 having a B2 structure, and a giant magnetoresistance effect layer 17 having at least one laminate layer including a lower ferromagnetic layer 14, an upper ferromagnetic layer 16, and a second non-magnetic layer 15 disposed between the lower ferromagnetic layer 14 and the upper ferromagnetic layer 16.

In the monocrystalline magnetoresistance element according to an aspect of the present invention, the silicon substrate 11 is preferably a Si(001) monocrystalline substrate. The base layer 12 having a B2 structure preferably comprises at least one selected from the group consisting of NiAl, CoAl, and FeAl. The first non-magnetic layer 13 preferably comprises at least one selected from the group consisting of Ag, V, Cr, W, Mo, Au, Pt, Pd, Ta, Ru, Re, Rh, NiO, CoO, TiN, and CuN. The lower ferromagnetic layer 14 preferably comprises at least one selected from the group consisting of a Co-based Heusler alloy, Fe, and CoFe. The second non-magnetic layer 15 preferably comprises at least one selected from the group consisting of Ag, Cr, Fe, W, Mo, Au, Pt, Pd, and Rh. The upper ferromagnetic layer 16 preferably comprises at least one selected from the group consisting of a Co-based Heusler alloy, Fe, and CoFe.

In the monocrystalline magnetoresistance element according to an aspect of the present invention, preferably, the Co-based Heusler alloy is represented by formula $Co_2YZ$, and in the formula, Y comprises at least one selected from the group consisting of Ti, V, Cr, Mn, and Fe, and Z comprises at least one selected from the group consisting of Al, Si, Ga, Ge, and Sn.

In the monocrystalline magnetoresistance element according to an aspect of the present invention, preferably, the base layer 12 having a B2 structure has a film thickness of 10 nm or more and less than 200 nm, the first non-magnetic layer 13 has a film thickness of 0.5 nm or more and less than 100 nm, the lower ferromagnetic layer 14 has a film thickness of 1 nm or more and less than 10 nm, the second non-magnetic layer 15 has a film thickness of 1 nm or more and less than 20 nm, and the upper ferromagnetic layer 16 has a film thickness of 1 nm or more and less than 10 nm.

Here, a case where the base layer 12 having a B2 structure has a film thickness of 200 nm or more makes surface roughness poorer, a case where the base layer 12 having a B2 structure has a film thickness of less than 10 nm is dominantly influenced by diffusion of the Si substrate and the base layer 12 having a B2 structure, and a magnetoresistance ratio required for the present application cannot be obtained. A case where the first non-magnetic layer 13 has a film thickness of 100 nm or more makes surface roughness poorer, a case where the first non-magnetic layer 13 has a film thickness of less than 0.5 nm does not form a continuous film and cannot obtain an effect as a base layer, and a magnetoresistance ratio required for the present application cannot be obtained. A case where each of the lower ferromagnetic layer 14 and the upper ferromagnetic layer 16 has a film thickness of 10 nm or more is largely influenced by spin relaxation in the ferromagnetic layer, a case where each of the lower ferromagnetic layer 14 and the upper ferromagnetic layer 16 has a film thickness of less than 1 nm has a small effect of spin asymmetric scattering in the ferromagnetic layer, and a magnetoresistance ratio required for the present application cannot be obtained. A case where the second non-magnetic layer 15 has a film thickness of 20 nm or more is largely influenced by spin relaxation in the non-magnetic layer, a case where the second non-magnetic layer 15 has a film thickness of 1 nm or less generates a magnetic bond between the upper ferromagnetic layer 16 and the lower ferromagnetic layer 14 and reduces a magnetization relative angle, and a magnetoresistance ratio required for the present application cannot be obtained.

In the monocrystalline magnetoresistance element according to an aspect of the present invention, preferably, the magnetoresistance ratio is 20% or more, and a resistance change-area product ($\Delta RA$) is 5 m$\Omega$ $\mu m^2$ or more.

In the monocrystalline magnetoresistance element according to an aspect of the present invention, a diffusion preventing layer inserted between the base layer having a B2 structure and the lower ferromagnetic layer is preferably further disposed.

In the monocrystalline magnetoresistance element according to an aspect of the present invention, the diffusion preventing layer preferably comprises at least one selected from the group consisting of Fe and CoFe.

In the monocrystalline magnetoresistance element according to an aspect of the present invention, the diffusion preventing layer preferably has a film thickness of 1 nm or more and less than 30 nm.

For example, as illustrated in FIG. 2, a method for producing a monocrystalline magnetoresistance element according to an aspect of the present invention includes a step of removing a natural oxide film of the silicon substrate 11 (S100), a step of setting the substrate temperature of the silicon substrate 11 to 300° C. or higher and 600° C. or lower (S102), a step of forming the base layer 12 having a B2 structure on the silicon substrate 11 from which the natural oxide film has been removed at the substrate temperature (S104), a step of forming a film of a first non-ferromagnetic material on the silicon substrate on which the base layer 12 has been formed at the substrate temperature (S106), a step of forming a giant magnetoresistance effect layer having at least one laminate layer including a lower ferromagnetic material layer, a second non-ferromagnetic material layer, and an upper ferromagnetic material layer on the silicon substrate on which the film of the first non-ferromagnetic material has been formed (S108), and a step of subjecting the silicon substrate on which the giant magnetoresistance effect layer has been formed to a heat treatment at 200° C. or higher and 600° C. or lower (S110).

Here, a case where the substrate temperature in the step of forming the base layer 12 is lower than 300° C. does not cause single crystal growth of the base layer 12, a case where the substrate temperature in the step of forming the base layer 12 is higher than 600° C. makes surface roughness of the base layer 12 poorer, and a magnetoresistance ratio required for the present application cannot be obtained. In addition, a case where the heat treatment temperature of the silicon substrate on which the giant magnetoresistance effect layer has been formed is lower than 200° C. does not cause atom regularization in the lower ferromagnetic layer or the upper ferromagnetic layer, a case where the heat treatment temperature of the silicon substrate on which the magnetoresistance effect layer has been formed is higher than 600° C. causes diffusion of the giant magnetoresistance effect layer, and a magnetoresistance ratio required for the present application cannot be obtained.

For example, as illustrated in FIG. 12, the method for producing a monocrystalline magnetoresistance element according to an aspect of the present invention preferably includes a step of fixating a film of a diffusion preventing material on the silicon substrate 11 on which the base layer 12 having a B2 structure has been formed at the substrate temperature (S106A) and a step of forming a film of a first non-ferromagnetic material on the silicon substrate 11 on which the film of the diffusion preventing material has been formed at the substrate temperature (S106B) in place of the step of forming a film of a first non-ferromagnetic material on the silicon substrate 11 on which the base layer 12 having a B2 structure has been formed at the substrate temperature (S106).

For example, as illustrated in FIG. 3, a monocrystalline magnetoresistance element according to an aspect of the present invention includes a silicon substrate 21, a base layer 22 having a B2 structure, laminated on the silicon substrate 21, and a tunnel magnetoresistance effect layer 27 having at least one laminate layer including a lower ferromagnetic layer 24, an upper ferromagnetic layer 26, and an insulating layer 25 disposed between the lower ferromagnetic layer 24 and the upper ferromagnetic layer 26, laminated on the base layer 22 having a B2 structure.

In the monocrystalline magnetoresistance element according to an aspect of the present invention, the silicon substrate 21 is preferably a Si(001) monocrystalline substrate. The lower ferromagnetic layer 24 preferably comprises at least one selected from the group consisting of a Co-based Heusler alloy, Fe, and CoFe. The insulating layer 25 is an in insulator having a NaCl structure and a spinel structure, and preferably comprises at least one selected from the group consisting of a MgO-based oxide, $Mg_2Al_2O_4$, $ZnAl_2O_4$, $MgCr_2O_4$, $MgMn_2O_4$, $CuCr_2O_4$, $NiCr_2O_4$, $GeMg_2O_4$, $SnMg_2O_4$, $TiMg_2O_4$, $SiMg_2O_4$, $CuAl_2O_4$, $Li_{0.5}Al_{2.5}O_4$, $\gamma$-$Al_2O_3$, and mixtures thereof. The upper ferromagnetic layer 26 preferably comprises at least one selected from the group consisting of a Co-based Heusler alloy, Fe, and CoFe.

In the monocrystalline magnetoresistance element according to an aspect of the present invention, preferably, the Co-based Heusler alloy is represented by formula $Co_2YZ$, and in the formula, Y comprises at least one selected from the group consisting of Ti, V, Cr, Mn, and Fe, and Z comprises at least one selected from the group consisting of Al, Si, Ga, Ge, and Sn. In addition, preferably, the MgO-based oxide is represented by formula $Mg_{1-x}Y_xO$, Y comprises at least one selected from the group consisting of Ti, V, Cr, Mn, Fe, Co, Ni, Cu, and Zn, and x is from 0 to 0.3.

In the monocrystalline magnetoresistance element according to an aspect of the present invention, preferably, the base layer 22 having a B2 structure has a film thickness of 10 nm or more and less than 200 nm, the lower ferromagnetic layer 24 has a film thickness of 0.5 nm or more and less than 50 nm, the insulating layer 25 has a film thickness of 0.5 nm or more and less than 4 nm, and the upper ferromagnetic layer 26 has a film thickness of 0.5 nm or more.

Here, a case where the base layer 22 having a B2 structure has a film thickness of 200 nm or more makes surface roughness poorer, a case where the base layer 22 having a B2 structure has a film thickness of less than 10 nm is dominantly influenced by diffusion of the Si substrate and the base layer, and a magnetoresistance ratio required for the present application cannot be obtained. A case where the lower ferromagnetic layer 24 has a film thickness of 50 nm or more makes surface roughness poorer to thereby make it impossible to laminate the insulating layer 25 flatly, a case where the lower ferromagnetic layer 24 has a film thickness of less than 0.5 nm does not form a continuous film, and a magnetoresistance ratio required for the present application cannot be obtained. A case where the insulating layer 25 has a film thickness of 4 nm or more makes a tunnel resistance too large, a case where the insulating layer 25 has a film thickness of less than 0.5 nm makes a spin filter effect of the insulating layer 25 small, and a magnetoresistance ratio required for the present application cannot be obtained. In addition, a case where the upper ferromagnetic layer 26 has a film thickness of less than 0.5 nm does not form a continuous film, and a magnetoresistance ratio required for the present application cannot be obtained.

In the monocrystalline magnetoresistance element according to an aspect of the present invention, the magnetoresistance ratio is preferably 50% or more.

For example, as illustrated in FIG. 4, a method for producing a monocrystalline magnetoresistance element according to an aspect of the present invention includes a step of removing a natural oxide film of the silicon substrate 21 (S200), a step of setting the substrate temperature of the silicon substrate 21 to 300° C. or higher and 600° C. or lower (S202), a step of forming the base layer 22 having a B2 structure on the silicon substrate 21 from which the natural oxide film has been removed at the substrate temperature (S204), a step of forming a tunnel magnetoresistance effect layer having at least one laminate layer including a lower ferromagnetic material layer, an insulating material layer, and an upper ferromagnetic material layer on the silicon substrate on which the base layer 22 has been formed (S206), and a step of subjecting the silicon substrate on which the tunnel magnetoresistance effect layer has been formed to a heat treatment at 200° C. or higher and 600° C. or lower (S208).

A case where the substrate temperature in the step of forming the base layer having a B2 structure is lower than 300° C. does not cause single crystal growth of the base layer, a case where the substrate temperature in the step of forming the base layer having a B2 structure is higher than 600° C. makes surface roughness of the base layer poorer, and a magnetoresistance ratio required for the present application cannot be obtained. In addition, a case where the heat treatment temperature of the silicon substrate on which the tunnel magnetoresistance effect layer has been formed is lower than 200° C. has low crystallinity of the insulating layer, a case where the heat treatment temperature of the silicon substrate on which the tunnel magnetoresistance effect layer has been formed is higher than 600° C. causes diffusion of the tunnel magnetoresistance effect layer, and a magnetoresistance ratio required for the present application cannot be obtained.

A device according to an aspect of the present invention uses the above monocrystalline magnetoresistance element.

The device is preferably any one of a read head used on a memory element, a magnetic field sensor, a spin electronic circuit, and a tunnel magnetoresistance (TMR) device.

Effect of the Invention

A monocrystalline magnetoresistance element according to an aspect of the present invention can provide a monocrystalline magnetoresistance element having a monocrystalline element with (001) orientation, similar to that on a MgO substrate on a Si substrate having a large diameter, and can provide a fundamental monocrystalline magnetoresistance element required for achieving mass productivity and low cost in order to apply a monocrystalline giant magnetoresistance element using a Heusler alloy to an actual device.

In addition, the monocrystalline magnetoresistance element according to an aspect of the present invention forms a stable silicide on a Si substrate interface by using a layer having a B2 structure as a base, can produce a monocrystalline giant magnetoresistance element having heat treatment resistance of 500° C. or higher and high interface flatness, and can obtain a characteristic equal to an element on a MgO substrate.

BRIEF DESCRIPTION OF THE DRAWINGS

FIG. 6 illustrates AFM images of a NiAl thin film grown on a Si(001) substrate at the substrate temperature of 300, 400, 500, and 600° C., respectively in an Example of the present invention;

FIG. 10 shows diagrams for explaining a magnetoresistance effect of a Si(001)/NiAl/Ag/CFGG/Ag/CFGG/Ag/Ru monocrystalline giant magnetoresistance element (heat treatment temperature 400° C.) in an Example of the present invention;

FIG. 15 illustrates a transmission electron microscope image of a cross section of a thin film in a Comparative Example of the present invention, and energy dispersion spectrum element mapping images of constituent elements.

DESCRIPTION OF THE EMBODIMENTS

Hereinafter, the present invention will be described with reference to the drawings.

Figure 1:
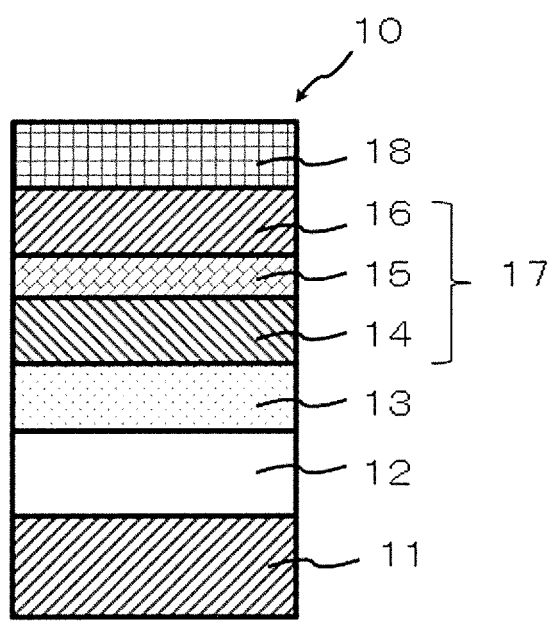
FIG. 1 is a structural cross section of a monocrystalline magnetoresistance element having a giant magnetoresistance effect layer according to a first embodiment of the present invention.

FIG. 1 is a structural cross section of a monocrystalline magnetoresistance element having a giant magnetoresistance effect layer according to a first embodiment of the present invention. In FIG. 1, a monocrystalline magnetoresistance element 10 having a giant magnetoresistance effect layer according to the present embodiment includes a silicon substrate 11, a base layer 12 having a B2 structure, laminated on the silicon substrate 11, a first non-magnetic layer 13 laminated on the base layer 12 having a B2 structure, a giant magnetoresistance effect layer 17, and a cap layer 18. The giant magnetoresistance effect layer 17 comprises a laminate layer including a lower ferromagnetic layer 14, an upper ferromagnetic layer 16, and a second non-magnetic layer 15 disposed between the lower ferromagnetic layer 14 and the upper ferromagnetic layer 16, but a plurality of the laminate layers may be laminated. The giant magnetoresistance effect layer 17 is located between the first non-magnetic layer 13 and the cap layer 18. Note that an upper electrode layer may be disposed on the cap layer 18, as necessary.

The silicon substrate 11 is a Si(001) monocrystalline substrate, and a Si substrate having a large diameter, such as a generally used Si substrate having a diameter of 8 inches can be used. The base layer 12 having a B2 structure is a chemically stable material in which lattice constants of NiAl, CoAl, and FeAl in the B2 structure are 0.288 nm, 0.286 nm, and 0.295 nm, respectively, and lattice mismatch with a Si(001) plane is relatively satisfactorily less than 10%, and which has a high melting point of higher than 1300° C. The base layer 12 having a B2 structure preferably has a film thickness of 10 nm or more and less than 200 nm. In the present invention, by employing the base layer 12 having a B2 structure, a ferromagnetic layer having a body-centered cubic lattice (bcc) structure as a basic structure can be formed on a Si(001) substrate as a monocrystalline thin film in a (001) direction of a Miller index.

The first non-magnetic layer 13 preferably comprises at least one selected from the group consisting of Ag, V, Cr, W, Mo, Au, Pt, Pd, Ta, Ru, Re, Rh, NiO, CoO, TiN, and CuN. The first non-magnetic layer 13 preferably has a film thickness of 0.5 nm or more and less than 100 nm.

The lower ferromagnetic layer 14 preferably comprises of at least one selected from the group consisting of a Co-based Heusler alloy, Fe, and CoFe. The lower ferromagnetic layer 14 preferably has a film thickness of 1 nm or more and less than 10 nm.

The second non-magnetic layer 15 preferably comprises at least one selected from the group consisting of Ag, Cr, W, Mo, Au, Pt, Pd, Ta, and Rh. The second non-magnetic layer 15 preferably has a film thickness of 1 nm or more and less than 20 nm.

The upper ferromagnetic layer 16 preferably comprises at least one selected from the group consisting of a Co-based Heusler alloy, Fe, and CoFe. The upper ferromagnetic layer 16 preferably has a film thickness of 1 nm or more and less than 10 nm.

The Co-based Heusler alloy is represented by formula $Co_2YZ$, and in the formula, preferably, Y comprises at least one selected from the group consisting of Ti, V, Cr, Mn, and Fe, and Z comprises at least one selected from the group consisting of Al, Si, Ga, Ge, and Sn.

The cap layer 18 preferably comprises at least one selected from the group consisting of Ag, Cr, W, Mo, Au, Pt, Pd, Ta, and Rh. The cap layer 18 preferably has a film thickness of 1 nm or more and less than 100 nm. When an upper electrode layer is disposed, Cu, Al, or the like often used as a material for an electrode is preferably used.

Next, a process for producing a device having such a structure will be described.

Figure 2:
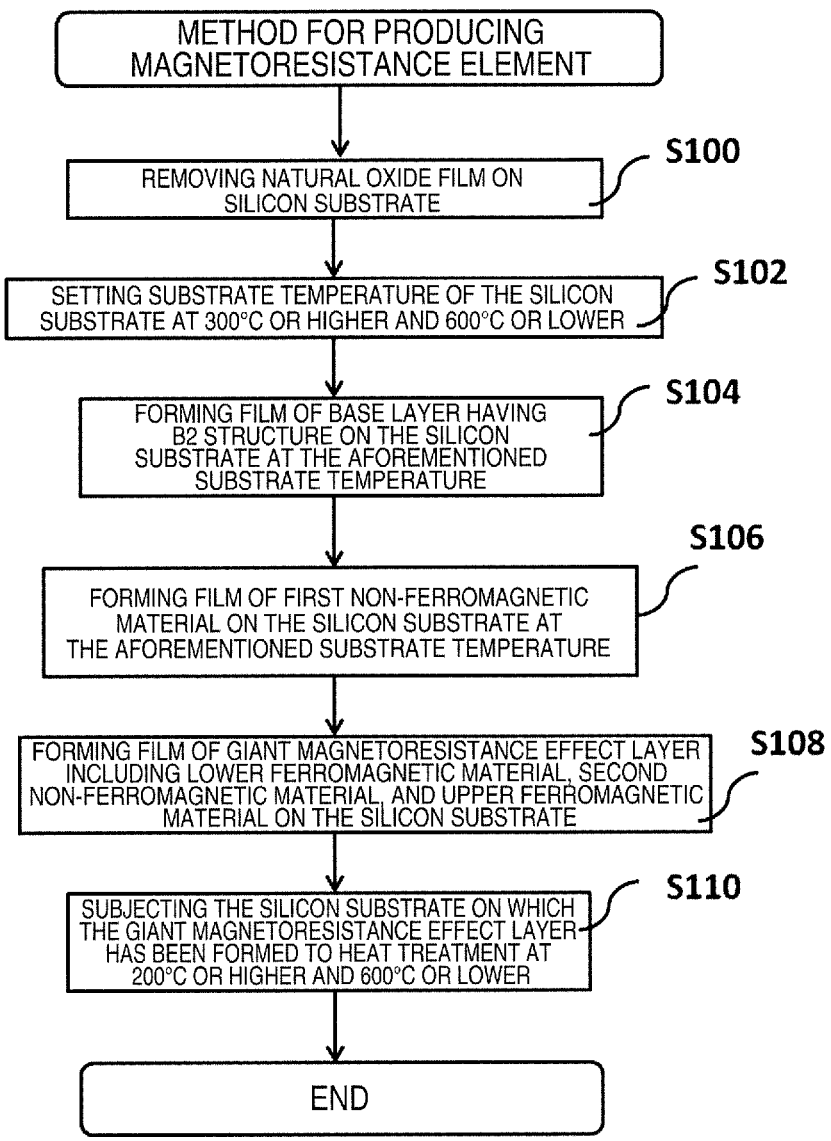
FIG. 2 is a flowchart for explaining a method for producing the monocrystalline magnetoresistance element having a giant magnetoresistance effect layer according to the first embodiment of the present invention.

FIG. 2 is a flowchart for explaining a method for producing the monocrystalline magnetoresistance element 10 having a giant magnetoresistance effect layer according to the first embodiment of the present invention. In FIG. 2, first, in the first step, a natural oxide film of the silicon substrate 11 is removed (S100), and subsequently the substrate temperature of the silicon substrate 11 is maintained at 300° C. or higher and 600° C. or lower (S102). Then, a base layer having a B2 structure is forming on the silicon substrate 11 from which the natural oxide film has been removed at the above substrate temperature to form the base layer 12 (S104). Subsequently, a film of a first non-ferromagnetic material is formed on the silicon substrate 11 on which the base layer 12 has been formed at the above substrate temperature (S106). The layer formed of the first non-ferromagnetic material corresponds to the first non-magnetic layer 13.

Subsequently, the giant magnetoresistance effect layer 17 having at least one laminate layer including a lower ferromagnetic material layer, a second non-ferromagnetic material layer, and an upper ferromagnetic material layer is formed on the silicon substrate 11 on which the film of the first non-ferromagnetic material has been formed (S108). Here, the layers formed of the lower ferromagnetic material, the second non-ferromagnetic material, and the upper ferromagnetic material correspond to the lower ferromagnetic layer 14, the second non-magnetic layer 15, and the upper ferromagnetic layer 16, respectively. Subsequently, the cap layer 18 is formed on the silicon substrate on which the giant magnetoresistance effect layer 17 has been formed. Finally, the silicon substrate on which the giant magnetoresistance effect layer 17 and the cap layer 18 have been formed is subjected to a heat treatment as post-annealing at 200° C. or higher and 600° C. or lower (S110).

Next, a second embodiment of the present invention will be described.

Figure 3:
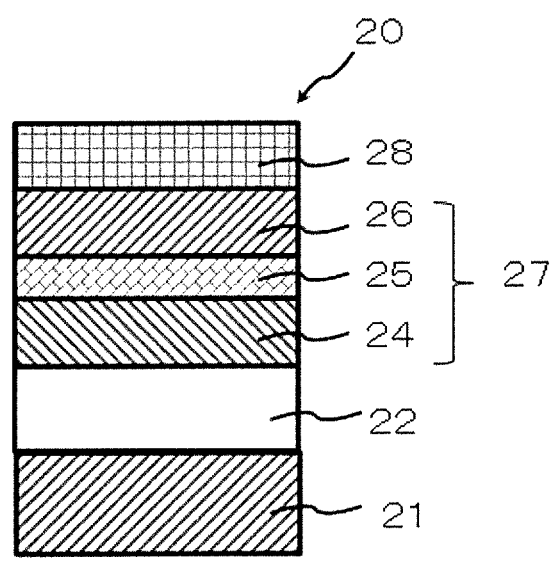
FIG. 3 is a structural cross section of a monocrystalline magnetoresistance element having a tunnel magnetoresistance effect layer according to a second embodiment of the present invention.

FIG. 3 is a structural cross section of a monocrystalline magnetoresistance element having a tunnel magnetoresistance effect layer according to the second embodiment of the present invention. A monocrystalline magnetoresistance element 20 according to the second embodiment includes a silicon substrate 21, a base layer 22 having a B2 structure, laminated on the silicon substrate 21, a tunnel magnetoresistance effect layer 27 laminated on the base layer 22 having a B2 structure, and a cap layer 28. The tunnel magnetoresistance effect layer 27 comprises a laminate layer including a lower ferromagnetic layer 24, an upper ferromagnetic layer 26, and an insulating layer 25 disposed between the lower ferromagnetic layer 24 and the upper ferromagnetic layer 26, but a plurality of the laminate layers may be laminated. The tunnel magnetoresistance effect layer 27 is located between the base layer 22 and the cap layer 28. Note that an upper electrode layer may be disposed on the cap layer 28, as necessary.

Note that the silicon substrate 21, the base layer 22 having a B2 structure, and the cap layer 28 in the second embodiment are similar to the silicon substrate 11, the base layer 12 having a B2 structure, and the cap layer 18 in the first embodiment, and therefore description thereof will be omitted.

The tunnel magnetoresistance effect layer 27 includes the lower ferromagnetic layer 24, the insulating layer 25, and the upper ferromagnetic layer 26. Note that the lower ferromagnetic layer 24 and the upper ferromagnetic layer 26 in the tunnel magnetoresistance effect layer 27 are similar to the lower ferromagnetic layer 14 and the upper ferromagnetic layer 16 in the giant magnetoresistance effect layer 17, and therefore description thereof will be omitted.

The insulating layer 25 is an in insulator having a NaCl structure and a spinel structure, and preferably comprises at least one selected from the group consisting of a MgO-based oxide, $Al_3O_4$, $Mg_2Al_2O_4$, $ZnAl_2O_4$, $MgCr_2O_4$, $MgMn_2O_4$, $CuCr_2O_4$, $NiCr_2O_4$, $GeMg_2O_4$, $SnMg_2O_4$, $TiMg_2O_4$, $SiMg_2O_4$, $CuAl_2O_4$, $Li_{0.5}Al_{2.5}O_4$, $\gamma$-$Al_2O_3$, and mixtures thereof. The insulating layer 25 preferably has a film thickness of 0.5 nm or more and less than 4 nm.

Figure 4:
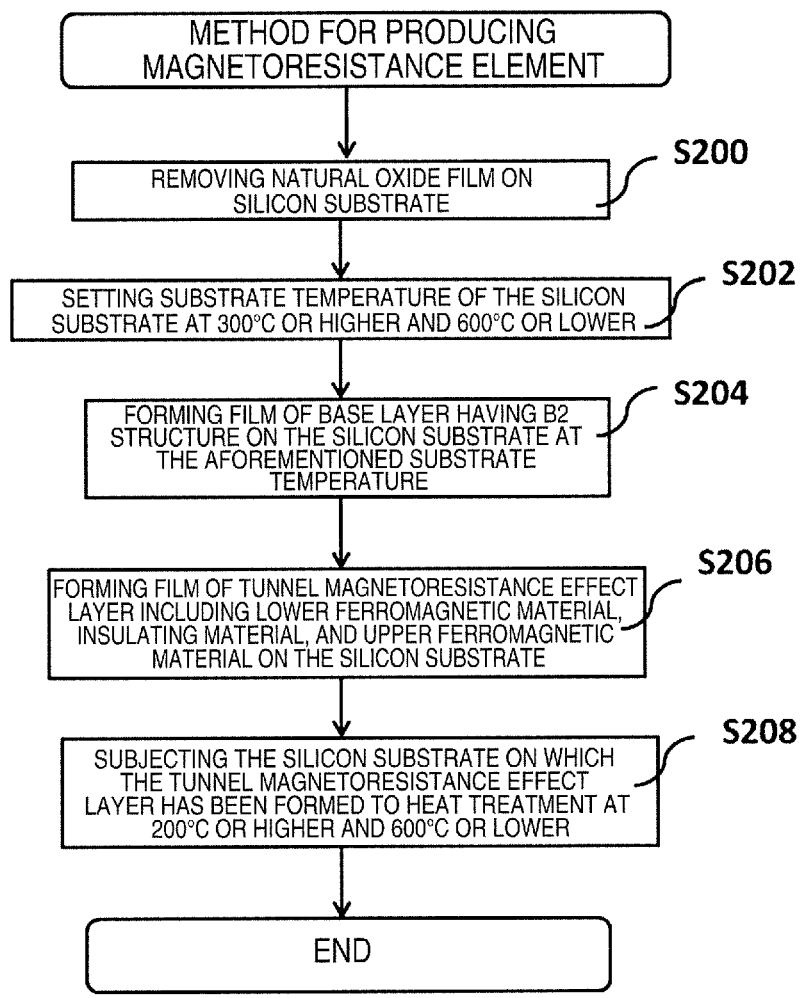
FIG. 4 is a flowchart for explaining a method for producing the monocrystalline magnetoresistance element having a tunnel magnetoresistance effect layer according to the second embodiment of the present invention.

FIG. 4 is a flowchart for explaining a method for producing the monocrystalline magnetoresistance element 20 having a tunnel magnetoresistance effect layer according to the second embodiment of the present invention. In FIG. 4, first, in the first step, a natural oxide film of the silicon substrate 21 is removed (S200), and subsequently the substrate temperature of the silicon substrate 21 is maintained at 300° C. or higher and 600° C. or lower (S202). Then, a base layer having a B2 structure is formed on the silicon substrate 21 from which the natural oxide film has been removed at the above substrate temperature to form the base layer 22 (S204).

Subsequently, the tunnel magnetoresistance effect layer 27 having at least one laminate layer including a lower ferromagnetic material layer, an insulating material layer, and an upper ferromagnetic material layer is formed on the silicon substrate on which the base layer having a B2 structure has been formed (S206). Here, the layers formed of the lower ferromagnetic material, the insulating material, and the upper ferromagnetic material correspond to the lower ferromagnetic layer 24, the insulating layer 25, and the upper ferromagnetic layer 26, respectively. Subsequently, the silicon substrate on which the tunnel magnetoresistance effect layer 27 has been formed is subjected to a heat treatment as post-annealing at 200° C. or higher and 600° C. or lower (S208).

The present invention described in the first and second embodiments can be used for a tunnel magnetoresistance element comprising a combination of a ferromagnetic layer of (001)Fe, Co, or the like and a monocrystalline oxide barrier of MgO, MgAlO, or the like, and a current perpendicular to plane-giant magnetoresistance element having a (001) Co-based Heusler alloy monocrystalline film as a ferromagnetic layer. Therefore, Examples will be described below.

EXAMPLES

In a first Example, a film of NiAl (thickness 50 nm) having a B2 structure was formed on a Si(001) monocrystalline substrate from which a natural oxide film on a surface thereof had been removed with diluted hydrofluoric acid at a substrate temperature of 300° C. to 600° C.

Figure 5:
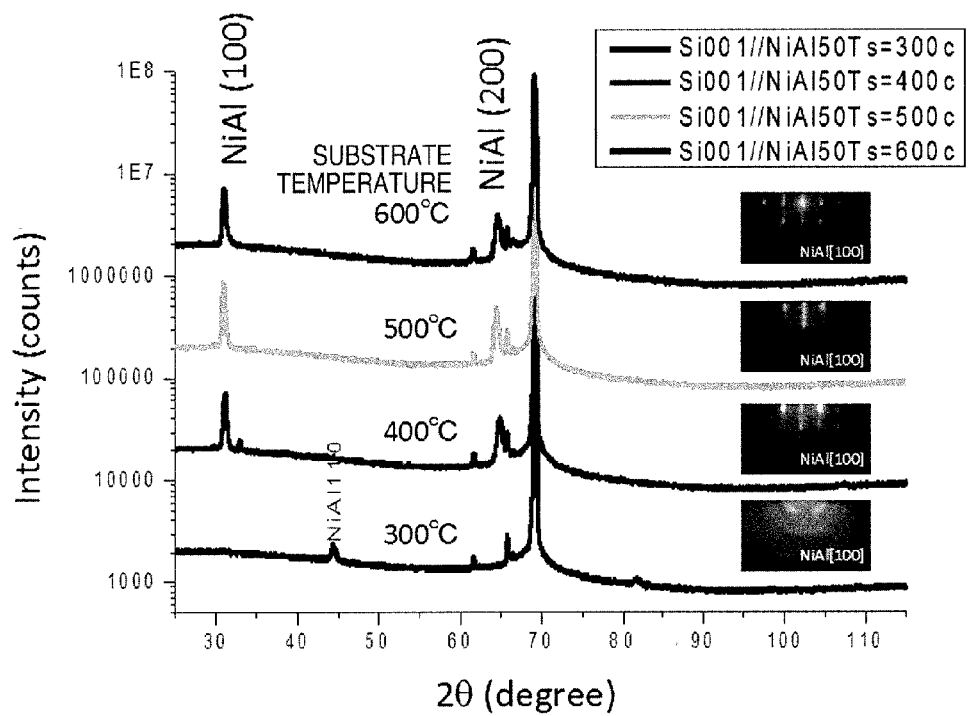
FIG. 5 illustrates an XRD pattern of a NiAl thin film grown on a Si(001) substrate at the substrate temperature of 300, 400, 500, or 600° C. in an Example of the present invention, and a RHEED image thereof.

FIG. 5 illustrates an XRD pattern of the NiAl thin film grown on the Si(001) substrate at the substrate temperature of 300, 400, 500, or 600° C. in an Example of the present invention, and a RHEED image thereof. The vertical axis indicates an intensity (count), and the horizontal axis indicates 2θ. As illustrated in FIG. 5, an X-ray diffraction pattern indicating single crystal growth of NiAl in a (001) direction and a streak of a reflection high energy electron diffraction (RHEED) image were observed at the substrate temperature of 400° C. to 600° C. On the other hand, an X-ray diffraction pattern indicating single crystal growth of NiAl in a (001) direction was not obtained but a peak in a (110) direction was obtained at the substrate temperature of 300° C.

FIG. 6 illustrates AFM images of a NiAl thin film grown on a Si(001) substrate at a predetermined substrate temperature in an Example of the present invention. (A) illustrates an image at the substrate temperature of 300° C., (B) illustrates an image at the substrate temperature of 400° C., (C) illustrates an image at the substrate temperature of 500° C., and (D) illustrates an image at the substrate temperature of 600° C. Surface roughness of the NiAl thin film was observed with an atomic force microscope (AFM). As a result, average surface roughness (Ra) was increased as the heat treatment temperature was higher. That is, as illustrated in FIGS. 6 (A) to (D), average surface roughness of 0.66 nm was obtained at the substrate temperature of 300° C., average surface roughness of 1.17 nm was obtained at the substrate temperature of 400° C., average surface roughness of 2.19 nm was obtained at the substrate temperature of 500° C., and average surface roughness of 3.47 nm was obtained at the substrate temperature of 600° C. Therefore, when single crystal growth of NiAl in a (001) direction was assumed, in the monocrystalline film, the smallest average surface roughness 1.17 nm was obtained in the NiAl layer formed at 400° C. That is, in the NiAl thin film grown on the Si(001) substrate at the substrate temperature of 400° C. to 600° C., average surface roughness on a surface of the NiAl thin film was from 1 to 4 nm. Note that P-V indicates the largest film thickness value in a Si(001) substrate measurement range of 5×5 μm$^2$ in FIGS. 6 (A) to (D).

Figure 7:
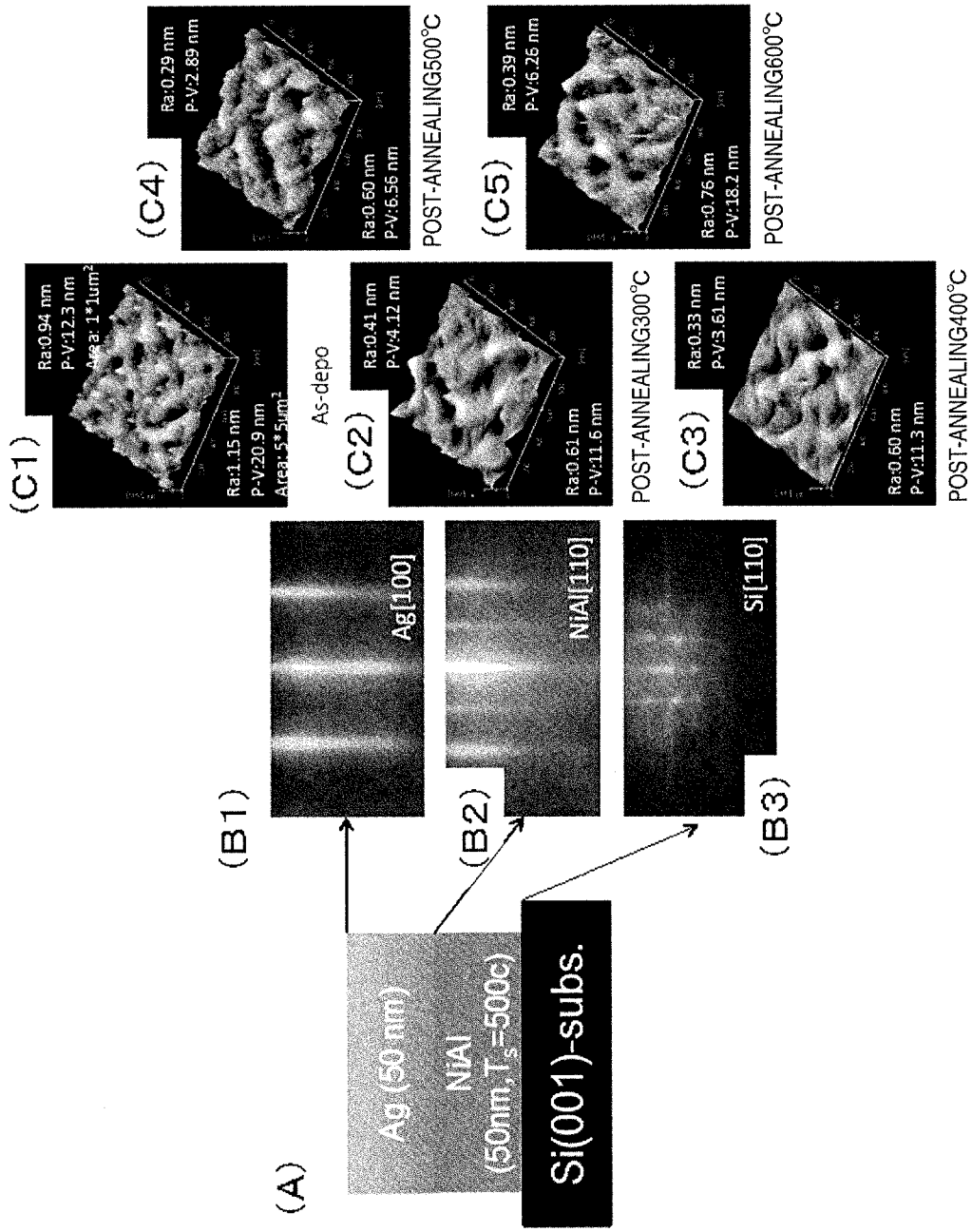
FIG. 7 illustrates RHEED images of an Ag layer grown on a Si(001) substrate/NiAl (50 nm) in an Example of the present invention, and AFM images thereof after post-annealing.

FIG. 7 illustrates RHEED images of an Ag layer grown on a Si(001) substrate/NiAl (50 nm) in an Example of the present invention, and AFM images thereof after post-annealing. (A) is a cross section structural diagram for simply explaining a laminated state in the substrate. (B1) to (B3) are reflection high energy electron diffraction (RHEED) images of the layers. (C1) to (C5) are AFM images on a surface of the Ag layer which has been subjected to post-annealing at a predetermined heat treatment temperature. Here, the NiAl layer was formed at the substrate temperature of 500° C. The Ag layer was formed at room temperature, and then was subjected to post-annealing at 300° C. to 600° C. FIG. 7 (B1) illustrates a RHEED image of the Ag layer in a [100] direction of a Miller index, FIG. 7 (B2) illustrates a RHEED image of the NiAl layer in a [110] direction of a Miller index, and FIG. 7 (B3) illustrates a RHEED image of the Si substrate in a [110] direction of a Miller index. (001)-oriented single crystal growth of Ag on NiAl was confirmed.

In addition, in the AFM images in FIG. 7, (C1) illustrates average surface roughness just after a film was formed. The average surface roughness was 0.94 nm in a case where a measurement range was 1×1 μm$^2$, and the average surface roughness was 1.15 nm in a case where a measurement range was 5×5 μm$^2$. In (C2), the average surface roughness was 0.41 nm after post-annealing at 300° C. In (C3), the average surface roughness was 0.33 nm after post-annealing at 400° C. In (C4), the average surface roughness was 0.29 nm after post-annealing at 500° C. In (C5), the average surface roughness was 0.39 nm after post-annealing at 600° C. Surface flatness was largely improved due to the Ag layer, and the average surface roughness Ra was improved to 0.29 nm by post-annealing at 500° C. Therefore, a range of the post-annealing temperature is preferably from 300° C. to 600° C.

Figure 8:
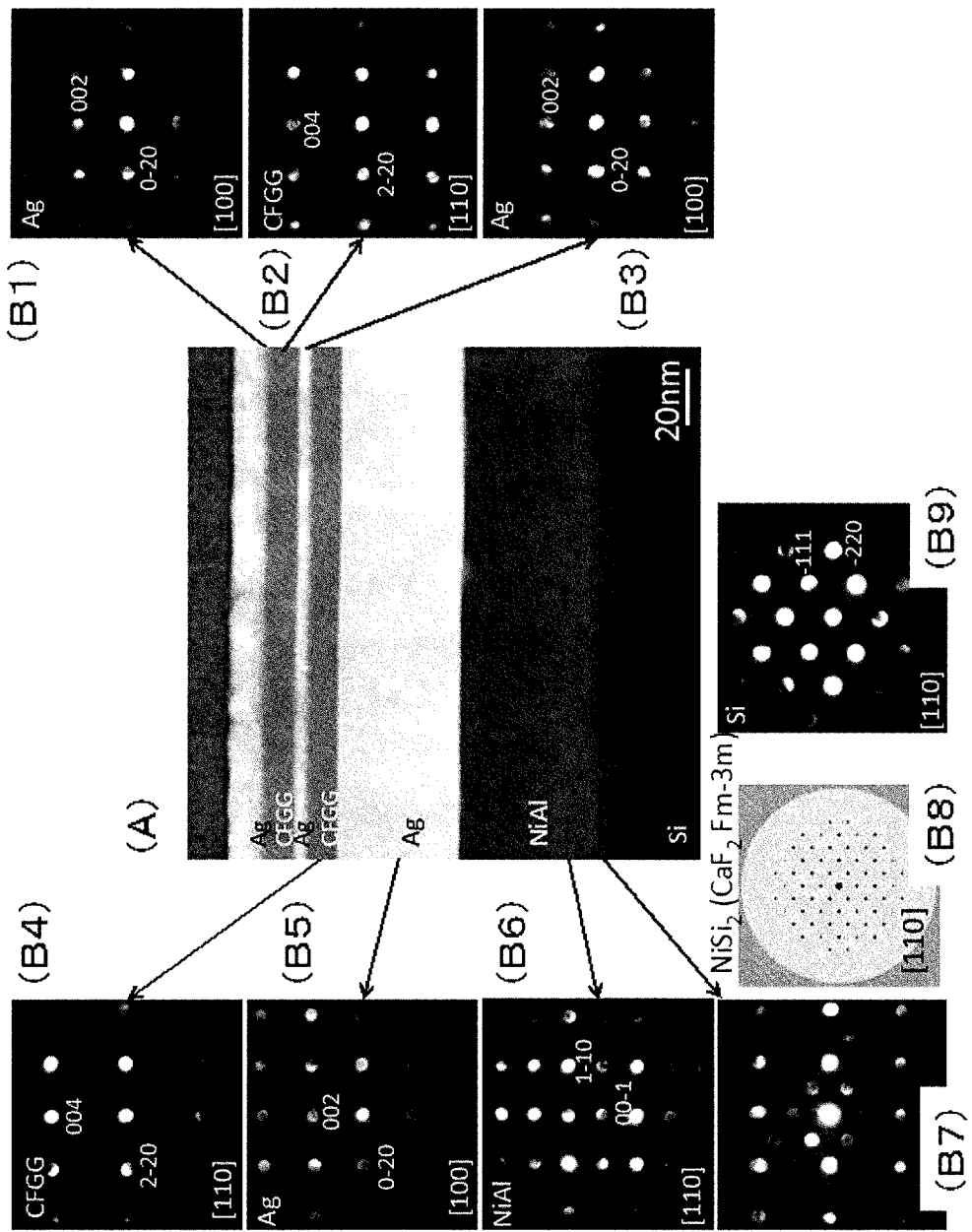
FIG. 8 illustrates a cross section electron microscope image of a Si(001)/NiAl/Ag/CFGG/Ag/CFGG/Ag/Ru thin film in an Example of the present invention, and diffraction images of the layers using a nano beam.

FIG. 8 illustrates cross section electron microscope images of a Si substrate/NiAl/Ag/Co$_2$FeGa$_{0.5}$Ge$_{0.5}$(CFGG)/Ag/CFGG/Ag/Ru giant magnetoresistance element film as an example of the magnetoresistance element, and diffraction images of the layers. In FIG. 8, (A) illustrates a cross section electron microscope image, (B1) illustrates a diffraction image of the Ag layer in a direction of a Miller index, (B2) illustrates a diffraction image of the CFGG layer in a [110] direction of a Miller index, (B3) illustrates a diffraction image of the Ag layer in a [100] direction of a Miller index, (B4) illustrates a diffraction image of the CFGG layer in a [110] direction of a Miller index, (B5) illustrates a diffraction image of the Ag layer in a [100] direction of a Miller index, (B6) illustrates a diffraction image of the NiAl layer in a [110] direction of a Miller index, (B7) illustrates a diffraction image of an interface between the Si substrate and the NiAl layer, (B8) illustrates a diffraction image of NiSi$_2$ (CaF$_2$, space group: Fm-3m) in a [110] direction of a Miller index, and (B9) illustrates a diffraction image of the Si substrate in a [110] direction of a Miller index.

Figure 9:
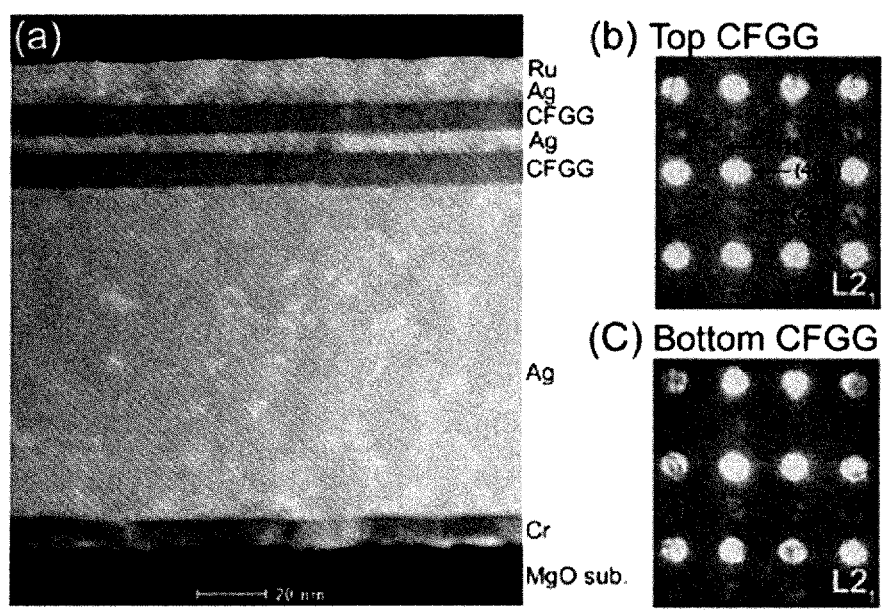
FIG. 9 illustrates a cross section electron microscope image of a Cr/Ag/CFGG/Ag/CFGG/Ag/Ru monocrystalline thin film grown on a MgO substrate in a Comparative Example of the present invention, and diffraction images of the CFGG layer.

FIG. 9 illustrates a cross section electron microscope image of a Cr/Ag/CFGG/Ag/CFGG/Ag/Ru monocrystalline thin film grown on a MgO substrate in a Comparative Example of the present invention, and diffraction images of the CFGG layer. (A) illustrates a cross section electron microscope image. (B) illustrates a diffraction image of an upper CFGG layer. (C) illustrates a diffraction image of a lower CFGG layer. Comparison between FIG. 8 (A) and FIG. 9 (A) indicates that laminated films having almost equal interface flatness were produced in FIG. 8 (A) and FIG. 9 (A). In addition, it is confirmed that all the layers were (001)-oriented films obtained by single crystal growth from diffraction images of the layers. As illustrated in FIG. 8 (B7), it was found that Ni was diffused to a Si substrate side to form NiSi$_2$ in an interface layer of the Si substrate/NiAl layer. This NiSi$_2$ layer was formed when the NiAl layer was formed on the Si substrate at the substrate temperature of 500° C. Therefore, it is considered that the NiSi$_2$ layer is stable even at a heat treatment temperature of 500° C. to CFGG/Ag/CFGG and serves as a diffusion preventing layer of the NiAl and the Si substrate.

FIG. 10 illustrates a result of MR measurement of a monocrystalline CFGG/Ag/CFGG CPP-GMR element grown on a Si substrate. In (A), the vertical axis indicates a magnetoresistance MR ratio, and the horizontal axis indicates a heat treatment temperature of the Si substrate. In (B), the vertical axis indicates a resistance (Ω), and the horizontal axis indicates a magnetic field (Oe). At a heat treatment temperature of 400° C. to CFGG/Ag/CFGG, the MR ratio was 28%, the resistance change-area product (ΔRA) was 8.7 mΩμm². Characteristics almost equal to those of the monocrystalline element produced on a MgO substrate could be obtained.

Figure 11:
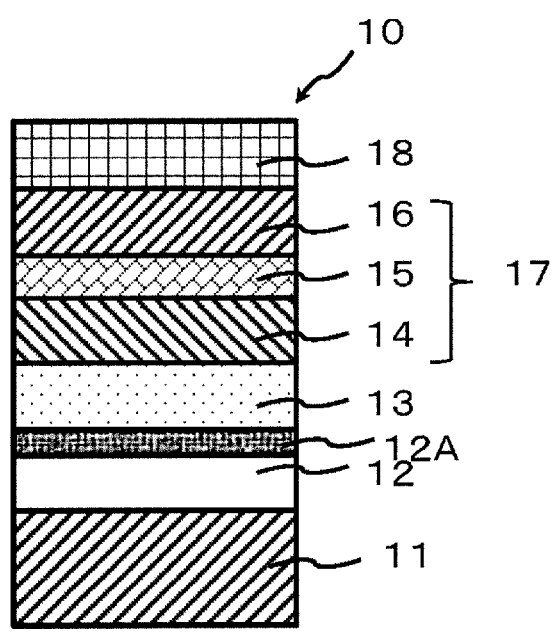
FIG. 11 is a structural cross section of a monocrystalline magnetoresistance element having a giant magnetoresistance effect layer according to a third embodiment of the present invention.

Next, a third embodiment of the present invention will be described. FIG. 11 is a structural cross section of a monocrystalline magnetoresistance element having a giant magnetoresistance effect layer according to the third embodiment of the present invention. In FIG. 11, note that the same sign will be given to a component having the same function as in FIG. 1, and description thereof will be omitted.

In FIG. 11, a CoFe layer as a diffusion preventing layer 12A is interposed between a base layer 12 having a B2 structure and a first non-magnetic layer 13. The CoFe layer preferably has a film thickness of 1 nm or more and less than 30 nm. A case where the CoFe layer has a film thickness of less than 1 nm does not form a continuous film, and a diffusion preventing effect required for the present application cannot be obtained. A case where the CoFe layer has a film thickness of 30 nm or more makes surface roughness poorer, and thereby makes it difficult to laminate a giant magnetoresistance effect layer 17 flatly.

Figure 12:
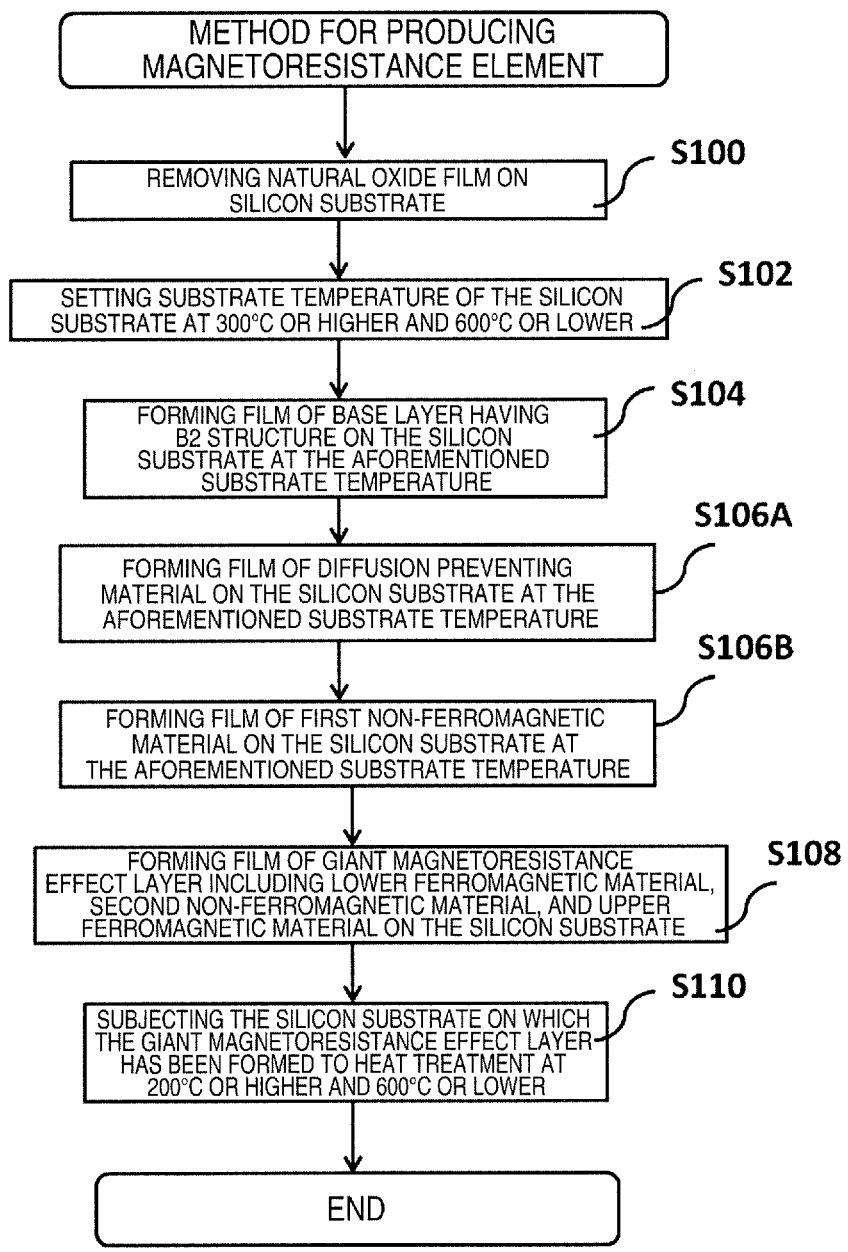
FIG. 12 is a flowchart for explaining a method for producing the monocrystalline magnetoresistance element having a giant magnetoresistance effect layer according to the third embodiment of the present invention.

FIG. 12 is a flowchart for explaining a method for producing the monocrystalline magnetoresistance element having a giant magnetoresistance effect layer according to the third embodiment of the present invention. In FIG. 12, note that the same sign will be given to a component having the same function as in FIG. 2, and description thereof will be omitted.

As illustrated in FIG. 12, the method for producing the monocrystalline magnetoresistance element according to the third embodiment preferably includes a step of forming a film of a diffusion preventing material on a silicon substrate 11 on which a base layer 12 having a B2 structure has been formed at the substrate temperature (S106A) and a step of forming a film of a first non-ferromagnetic material on the silicon substrate 11 on which the film of the diffusion preventing material has been formed at the substrate temperature (S106B) in place of the step of forming a film of the first non-ferromagnetic material on the silicon substrate 11 on which the base layer 12 having a B2 structure has been formed at the substrate temperature, illustrated in FIG. 2 (S106). By forming the film of the diffusion preventing material, a film structure in which the diffusion preventing layer 12A is interposed between the base layer 12 having a B2 structure and the first non-magnetic layer 13 is obtained.

Figure 13:
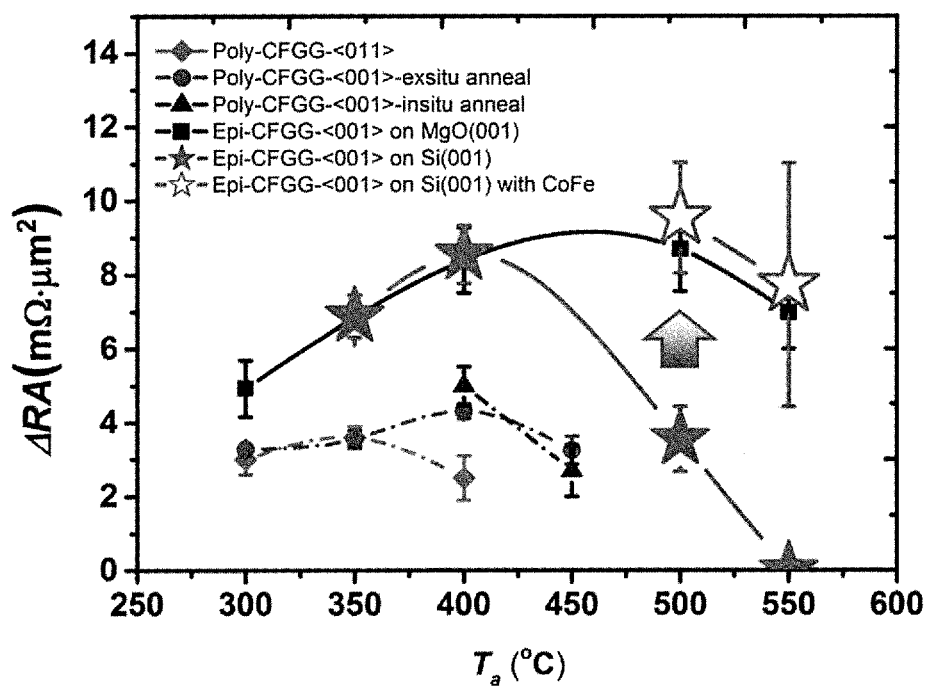
FIG. 13 is a diagram for explaining heat treatment temperature dependency of a magnetoresistance effect of a giant magnetoresistance element in each of the third Example and Comparative Examples of the present invention.

FIG. 13 is a diagram for explaining heat treatment temperature dependency of a magnetoresistance effect of a giant magnetoresistance element in each of the third Example and Comparative Examples of the present invention. The horizontal axis indicates an annealing treatment temperature, and the vertical axis indicates a resistance change-area product (ΔRA).

The third Example of the present invention is an epi-type giant magnetoresistance element film which is a single crystal obtained by laminating Si(001)/NiAl/CoFe/Ag/CFGG/Ag/CFGG/Ag/Ru, and is indicated by an open star mark, ☆, in FIG. 13. Comparative Example 1 is an epi-type giant magnetoresistance element film which is a single crystal obtained by laminating Si(001)/NiAl/Ag/CFGG/Ag/CFGG/Ag/Ru, and is indicated by a filled star mark, ★, in FIG. 13. Comparative Example 2 is an epi-type giant magnetoresistance element film which is a single crystal obtained by laminating MgO(001)/NiAl/Ag/CFGG/Ag/CFGG/Ag/Ru, and is indicated by a filled square mark, ■, in FIG. 13. Comparative Example 3 is a polycrystalline giant magnetoresistance element film which has been subjected to an insitu annealing treatment, and is indicated by a filled triangle mark, ▲, in FIG. 13. Comparative Example 4 is a polycrystalline giant magnetoresistance element film which has been subjected to an exsitu annealing treatment, and is indicated by a filled circle mark, ●, in FIG. 13. Comparative Example 5 is a polycrystalline giant magnetoresistance element film when crystal growth occurs in a (011)-oriented film, and is indicated by a filled rhomboid mark, ♦, in FIG. 13.

In the third Example of the present invention, by disposing the CoFe layer as the diffusion preventing layer 12A between the base layer 12 having a B2 structure and the first non-magnetic layer 13, even when the annealing treatment temperature is within a range of 450° C. to 550° C. higher than 400° C., the resistance change-area product (ΔRA) is maintained at a characteristic equal to or slightly better than a case where the annealing treatment temperature is 400° C. Meanwhile, in Comparative Example 1, the laminate structure is equal to that in the third Example of the present invention except that the diffusion preventing layer 12A is not included, but when the annealing treatment temperature is within a range of 450° C. to 550° C. higher than 400° C., the resistance change-area product (ΔRA) is poorer than a case where the annealing treatment temperature is 400° C. In Comparative Example 2, expensive MgO(001) is used in place of silicon(001) as a substrate, but annealing treatment temperature dependency of the resistance change-area product (ΔRA) is equal to that in the third Example of the present invention.

In Comparative Examples 3 to 5, polycrystalline giant magnetoresistance element films are used, and therefore the resistance change-area product (ΔRA) is much lower than that in the third Example of the present invention.

Figure 14:
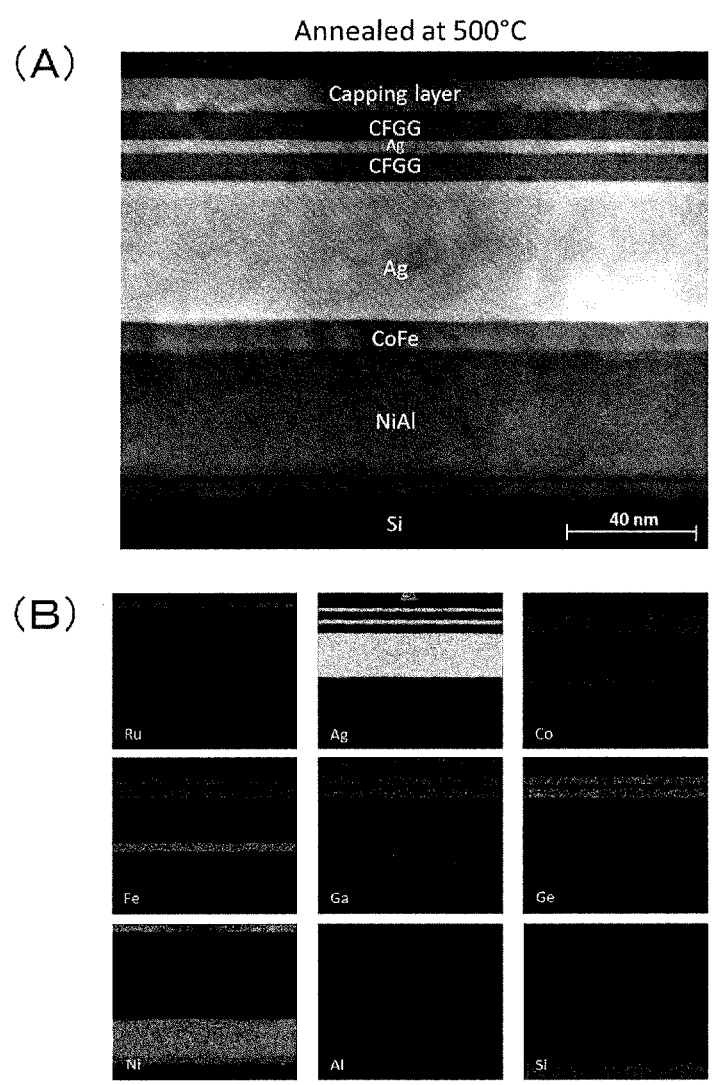
FIG. 14 illustrates a transmission electron microscope image of a cross section of a thin film in the third Example of the present invention, and energy dispersion spectrum element mapping images of constituent elements.

FIG. 14 illustrates cross sections of a thin film according to the third Example of the present invention. (A) illustrates a transmission electron microscope image. (B) illustrates energy dispersion spectrum element mapping images of constituent elements. As the constituent elements, Ru, Ag, and Co are indicated from the left side of the upper row toward the right side of the upper row, Fe, Ga, and Ge are indicated from the left side of the middle row toward the right side of the middle row, and Ni, Al, and Si are indicated from the left side of the lower row toward the right side of the lower row.

Presence of the CoFe layer as the diffusion preventing layer 12A prevents diffusion of Al from the NiAl layer as the base layer 12 having a B2 structure to the Ag layer as the first non-magnetic layer 13.

FIG. 15 illustrates cross sections of a thin film in a Comparative Example of the present invention. (A) illustrates a transmission electron microscope image. (B) illustrates energy dispersion spectrum element mapping images of constituent elements. Note that an arrangement relation among the constituent elements in FIG. 15(B) is similar to that in FIG. 14(B).

Because of no presence of the CoFe layer as the diffusion preventing layer 12A, when the annealing treatment temperature is as high as 400° C., diffusion of Al occurs from the NiAl layer as the base layer 12 having a B2 structure to the Ag layer as the first non-magnetic layer 13.

The (001)-oriented monocrystalline magnetoresistance element on the Si substrate, produced in the present invention is formed of NiAl base layer/Ag base layer/magnetoresistance element film/cap layer, but has a possibility that the layers can be replaced as follows.

The Ag base layer can be replaced with a material which can cause (001)-oriented single crystal growth on NiAl. For example, in a single material having lattice mismatch of less than 10% with NiAl, such as a bcc material including Cr, Fe, W, and Mo, or a fcc material including Au, Pt, Pd, and Rh, single crystal growth is expected. Therefore, the Ag base layer can be replaced with such a single material or a laminated structure thereof.

The magnetoresistance element can be applied to all the combinations of a ferromagnetic body and a non-magnetic body or an insulator, having a lattice constant similar to the base layer. As the ferromagnetic body, a Heusler alloy other than CFGG, such as $Co_2MnSi$ or $Co_2FeAl$, and a general ferromagnetic body having a bcc structure, such as Fe or CoFe can be used. Application is possible to all the other spacers having excellent lattice match, such as NiAl, AgZn, CuZn, or $Ag_3Mg$ as a non-magnetic intermediate layer in addition to Ag. In addition, also when MgO or $Mg_2AlO_x$ is used as a tunnel barrier layer of a tunnel magnetoresistance element, lattice match is obtained. Therefore, a monocrystalline tunnel magnetoresistance element can be grown on a Si substrate.

INDUSTRIAL APPLICABILITY

The monocrystalline magnetoresistance element according to an aspect of the present invention is obtained by epitaxially growing a (001) plane of a body-centered cubic lattice ferromagnetic layer on a Si monocrystalline substrate having a large diameter, is inexpensive, and is suitable for mass-supply. Therefore, the monocrystalline magnetoresistance element is preferably used for a practical device such as a magnetic head using a tunnel magnetoresistance element or a current perpendicular to plane-giant magnetoresistance element, a magnetic field sensor, a spin electronic circuit, or a tunnel magnetoresistance device.

What is claimed is:

1. A magnetoresistance element comprising:
   a silicon substrate;
   a base layer having a B2 structure, laminated on the silicon substrate;
   a first non-magnetic layer laminated on the base layer having a B2 structure; and
   a giant magnetoresistance effect layer having at least one laminate layer including a lower ferromagnetic layer, an upper ferromagnetic layer, and a second non-magnetic layer disposed between the lower ferromagnetic layer and the upper ferromagnetic layer, wherein the silicon substrate is a Si(001) monocrystalline substrate,
   the base layer having a B2 structure is at least one selected from the group consisting of NiAl, CoAl, and FeAl,
   the first non-magnetic layer is at least one selected from the group consisting of Ag, V, Cr, W, Mo, Au, Pt, Pd, Ta, Ru, Re, Rh, NiO, CoO, TiN, and CuN,
   the lower ferromagnetic layer comprises at least one selected from the group consisting of a Co-based Heusler alloy, Fe, and CoFe,
   the second non-magnetic layer comprises at least one selected from the group consisting of Ag, Cr, W, Mo, Au, Pt, Pd, Ta, and Rh, and
   the upper ferromagnetic layer comprises at least one selected from the group consisting of a Co-based Heusler alloy, Fe, and CoFe.

2. The magnetoresistance element according to claim 1, wherein
   the Co-based Heusler alloy is represented by formula $Co_2YZ$, and
   in the formula, Y comprises at least one selected from the group consisting of Ti, V, Cr, Mn, and Fe, and Z comprises at least one selected from the group consisting of Al, Si, Ga, Ge, and Sn.

3. The magnetoresistance element according to claim 1, wherein
   the base layer having a B2 structure has a film thickness of 10 nm or more and less than 200 nm,
   the first non-magnetic layer has a film thickness of 0.5 nm or more and less than 100 nm,
   the lower ferromagnetic layer has a film thickness of 1 nm or more and less than 10 nm,
   the second non-magnetic layer has a film thickness of 1 nm or more and less than 20 nm, and
   the upper ferromagnetic layer has a film thickness of 1 nm or more and less than 10 nm.

4. The magnetoresistance element according to claim 1, having a magnetoresistance ratio of 20% or more and a resistance change-area product ($\Delta RA$) of 5 $m\Omega\mu m^2$ or more.

5. The magnetoresistance element according to claim 1, further comprising a diffusion preventing layer inserted between the base layer having a B2 structure and the lower ferromagnetic layer.

6. The magnetoresistance element according to claim 5, wherein the diffusion preventing layer comprises at least one selected from the group consisting of Fe and CoFe.

7. The magnetoresistance element according to claim 6, wherein the diffusion preventing layer has a film thickness of 1 nm or more and less than 30 nm.

8. A device using the magnetoresistance element according to claim 1.

9. The device according to claim 8, wherein the device is any one of a read head used on a memory element, a magnetic field sensor, a spin electronic circuit, and a tunnel magnetoresistance (TMR) device.

10. A device using a magnetoresistance element, the magnetoresistance element comprising:
    a silicon substrate;
    a base layer having a B2 structure, laminated on the silicon substrate;
    a first non-magnetic layer laminated on the base layer having a B2 structure; and
    a giant magnetoresistance effect layer having at least one laminate layer including a lower ferromagnetic layer, an upper ferromagnetic layer, and a second non-magnetic layer disposed between the lower ferromagnetic layer and the upper ferromagnetic layer,
    wherein the device is any one of a read head used on a memory element, a magnetic field sensor, a spin electronic circuit, and a tunnel magnetoresistance (TMR) device.

* * * * *